United States Patent
Kato et al.

(10) Patent No.: US 11,908,629 B2
(45) Date of Patent: Feb. 20, 2024

(54) ELECTRET SHEET AND PIEZOELECTRIC SENSOR

(71) Applicant: SEKISUI CHEMICAL CO., LTD., Osaka (JP)

(72) Inventors: Tetsuhiro Kato, Osaka (JP); Nobuto Kamiya, Osaka (JP); Yasuyuki Shirasaka, Osaka (JP); Yuuta Katsurayama, Osaka (JP); Ryousuke Takahashi, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 453 days.

(21) Appl. No.: 17/270,664

(22) PCT Filed: Aug. 23, 2019

(86) PCT No.: PCT/JP2019/033090
§ 371 (c)(1),
(2) Date: Feb. 23, 2021

(87) PCT Pub. No.: WO2020/040301
PCT Pub. Date: Feb. 27, 2020

(65) Prior Publication Data
US 2021/0257165 A1  Aug. 19, 2021

(30) Foreign Application Priority Data
Aug. 24, 2018 (JP) .................... 2018-157398

(51) Int. Cl.
*H01G 7/02* (2006.01)
*H10N 30/857* (2023.01)

(52) U.S. Cl.
CPC .......... *H01G 7/023* (2013.01); *H10N 30/857* (2023.02)

(58) Field of Classification Search
CPC ........ H01G 7/023; H01G 4/18; H10N 30/857; H10N 30/302
(Continued)

(56) References Cited

U.S. PATENT DOCUMENTS

| | | | |
|---|---|---|---|
| 2014/0091249 A1 | 4/2014 | Uchida et al. | |
| 2019/0057816 A1 | 2/2019 | Kato et al. | |

FOREIGN PATENT DOCUMENTS

| | | | |
|---|---|---|---|
| CN | 103548103 | | 1/2014 |
| JP | 3567480 | * | 9/2004 |

(Continued)

OTHER PUBLICATIONS

International Search Report dated Nov. 12, 2019 in International (PCT) Application No. PCT/JP2019/033090.

*Primary Examiner* — Richard Tan
(74) *Attorney, Agent, or Firm* — Wenderoth, Lind & Ponack, L.L.P.

(57) ABSTRACT

The present invention provides an electret sheet that has excellent durability against a pressing force that is repetitively applied, that is, excellent compression recovery properties, and can suppress stuffiness even when used by attaching it to the skin of a human body. The electret sheet of the present invention has an air permeability of 10 to 1,000 sec/100 mL. Thus, the electret sheet has excellent durability against a pressing force that is repetitively applied, that is, excellent compression recovery properties, and can suppress stuffiness even when used by attaching it to the skin of a human body.

8 Claims, 1 Drawing Sheet

(58) Field of Classification Search
USPC .......................................................... 307/400
See application file for complete search history.

(56) References Cited

FOREIGN PATENT DOCUMENTS

| | | | |
|---|---|---|---|
| JP | 2013100458 | * | 5/2013 |
| JP | 2013-258320 | | 12/2013 |
| JP | 2014-11282 | | 1/2014 |
| JP | 2014-93313 | | 5/2014 |
| JP | 2014-100868 | | 6/2014 |
| JP | 2014-207391 | | 10/2014 |
| JP | 2015-93167 | | 5/2015 |
| JP | 2016039275 | * | 3/2016 |
| JP | 2017-64338 | | 4/2017 |
| JP | 2017-139469 | | 8/2017 |

* cited by examiner

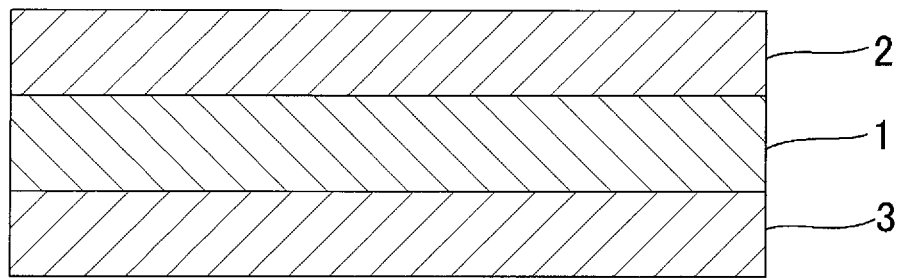

ELECTRET SHEET AND PIEZOELECTRIC SENSOR

TECHNICAL FIELD

The present invention relates to an electret sheet and a piezoelectric sensor.

BACKGROUND ART

An electret sheet is a permanently internally charged material obtained by injecting electric charges into an insulating polymer material.

It is known that a foamed sheet made of a synthetic resin exhibits very high piezoelectricity, which is comparable to that of ceramics, by charging a cell membrane forming cells and the vicinities thereof. It has been proposed that an electret that uses such a foamed sheet made of the synthetic resin is applied to acoustic pickups, various pressure sensors, and the like by utilizing an excellent sensitivity of the electret.

As an electret sheet, Patent Literature 1 discloses an electret sheet that is obtained by charging a laminated sheet in which two synthetic resin sheets with different compressive elastic moduli are integrally laminated. As the synthetic resin sheet, a synthetic resin foamed sheet is used.

CITATION LIST

Patent Literature

Patent Literature 1: Japanese Patent Application Laid-Open No. 2014-11282

SUMMARY OF INVENTION

Technical Problem

However, the electret sheet of Patent Literature 1 comprises a foamed sheet having closed cells and thus has low compression recovery properties. The electret sheet has problems in which applying a pressing force repeatedly to the electret sheet reduces a recovery force against compression gradually. Thus, the piezoelectricity of the electret sheet is reduced as the electret sheet is used.

There is also a problem that the electret sheet causes stuffiness, For example, when the electret sheet is attached to the skin surface of a human body for measurement of a biological signal.

The present invention provides an electret sheet that has excellent durability against a pressing force that is repetitively applied, that is, excellent compression recovery properties, and can suppress stuffiness even when used by attaching it to the skin of a human body.

Solution to Problem

An electret sheet of the present invention has an air permeability of 10 to 1,000 sec/100 mL.

Advantageous Effects of Invention

The electret sheet of the present invention has the aforementioned configuration. Thus, the electret sheet has excellent durability against a pressing force that is repetitively applied, that is, excellent compression recovery properties, and stably retains excellent piezoelectricity over a long period of time.

Furthermore, the electret sheet of the present invention can generally suppress stuffiness, for example, even when used by attaching it to the skin of a human body. Thus, a piezoelectric sensor using the electret sheet of the present invention can easily measure a biological signal such as a respiratory rate, a heart rate, or a body motion without imposing a burden on a subject of which the biological signal is to be measured.

BRIEF DESCRIPTION OF THE DRAWINGS

FIG. 1 is a cross-sectional view illustrating a piezoelectric sensor.

DESCRIPTION OF EMBODIMENTS

An electret sheet includes an electret sheet body. The electret sheet body of the electret sheet is charged. That is, the electret sheet body is charged to constitute the electret sheet. The electret sheet body includes a synthetic resin. The electret sheet includes the electret sheet body that includes the synthetic resin and also has been charged. The synthetic resin is not particularly limited, and examples thereof include a polyolefin-based resin such as a polyethylene-based resin and a polypropylene-based resin, a polyvinylidene fluoride, a polylactic acid, and a liquid crystal resin. The synthetic resin preferably includes a polyolefin-based resin, and more preferably a polypropylene-based resin.

The synthetic resin is preferably excellent in insulation. Specifically, the synthetic resin preferably has a volume resistivity value of $1.0 \times 10^{10}$ Ω·m or more. Here, the volume resistivity value is measured one minute after applying a voltage of 500 V according to JIS K6911 (hereinafter simply referred to as a "volume resistivity value").

The volume resistivity of the synthetic resin is preferably $1.0 \times 10^{12}$ Ω·m or more, and more preferably $1.0 \times 10^{14}$ Ω·m or more, because the resulting electret sheet has more excellent piezoelectricity.

Examples of the polyethylene-based resin include an ethylene homopolymer and a copolymer of ethylene and at least one kind of α-olefins having 3 to 20 carbon atoms in which an amount of the ethylene component exceeds 50% by mass. Examples of the ethylene homopolymer include a low-density polyethylene (LDPE) which is obtained by radical polymerization under a high pressure, and a medium/low pressure processed high-density polyethylene (HDPE) which is obtained by polymerization in the presence of a catalyst under a medium/low pressure. A linear low-density polyethylene (LLDPE) can be obtained by copolymerization of ethylene and an α-olefin. Examples of the α-olefin include propylene, 1-butene, 1-pentene, 1-hexene, 4-methyl-1-pentene, 1-octene, 1-nonene, 1-decene, 1-tetradecene, 1-hexadecene, 1-octadecene, and 1-eicosene. Of these, an α-olefin having 4 to 10 carbon atoms is preferable. Note that the content of the α-olefin in the linear low-density polyethylene is usually 1 to 15% by mass.

The polypropylene-based resin is not particularly limited as long as it includes more than 50% by mass of a propylene component. Preferable examples thereof include a propylene homopolymer (homopolypropylene), and a copolymer of propylene and at least one kind of α-olefins having 20 or less carbon atoms other than propylene. Note that the polypropylene-based resin may be used alone, or two or more kinds thereof may be used in combination. Further, the copolymer of propylene and at least one kind of α-olefins having 20 or less carbon atoms other than propylene may be any of a block copolymer and a random copolymer, but a random copolymer is preferable. As the polyolefin-based resin, a propylene-α-olefin random copolymer is preferable. The content of the propylene-α-olefin random copolymer in the polyolefin-based resin is preferably 60 to 100% by mass, more preferably 70 to 100% by mass, particularly preferably 85 to 100% by mass, and most preferably 96 to 100% by mass. The propylene-α-olefin random copolymer of which the content falls within the above-described range allows the electret sheet to retain high piezoelectricity even under a high temperature environment.

Examples of the α-olefin copolymerized with propylene include ethylene, 1-butene, 1-pentene, 4-methyl-1-pentene, 1-hexene, 1-octene, 1-nonene, 1-decene, 1-tetradecene, 1-hexadecene, 1-octadecene, and 1-eicosene.

The weight-average molecular weight of the polyolefin-based resin is not particularly limited, but is preferably 30,000 to 500,000, and more preferably 50,000 to 480,000. The weight-average molecular weight of the polypropylene-based resin is not particularly limited, but is preferably 250,000 to 500,000, and more preferably 280,000 to 480,000. The weight-average molecular weight of the polyethylene-based resin is not particularly limited, but is preferably 30,000 to 250,000, and more preferably 50,000 to 200,000. The polyolefin-based resin of which the weight-average molecular weight falls within the above-described range further improves the compression recovery properties of the electret sheet. Thus, the electret sheet retains excellent piezoelectricity over a long period of time.

The molecular weight distribution (weight-average molecular weight Mw/number-average molecular weight Mn) of the polyolefin-based resin is not particularly limited, but is preferably 5 to 30, and more preferably 7.5 to 25. The molecular weight distribution of the polypropylene-based resin is not particularly limited, but is preferably 7.5 to 12, and more preferably 8 to 11. The molecular weight distribution of the polyethylene-based resin is not particularly limited, but is preferably 5.0 to 30, and more preferably 8.0 to 25. The polyolefin-based resin of which the molecular weight distribution falls within the above-described range further improves the compression recovery properties of the electret sheet. Thus, the electret sheet retains excellent piezoelectricity over a long period of time.

Herein, the weight-average molecular weight and the number-average molecular weight of the polyolefin-based resin are polystyrene-equivalent values measured by a GPC (gel permeation chromatography) method. Specifically, 6 to 7 mg of a polyolefin-based resin is collected, and the collected polyolefin-based resin is supplied to a test tube. Then, an o-DCB (orthodichlorobenzene) solution including 0.05% by mass of BHT (dibutylhydroxytoluene) is added to the test tube to dilute it so that the concentration of the polyolefin-based resin becomes 1 mg/mL. As a result, a diluted solution is prepared.

The above-described diluted solution is shaken at a number of rotations of 25 rpm for 1 hour at 145° C. using a dissolution filtration apparatus to dissolve the polyolefin-based resin in the o-DCB solution, thereby obtaining a measurement sample. The weight-average molecular weight and the number-average molecular weight of the polyolefin-based resin can be measured by the GPC method using the measurement sample.

The weight-average molecular weight and the number-average molecular weight of the polyolefin-based resin can be measured, for example, by the following measurement apparatus and measurement conditions.
Measurement apparatus: trade name "HLC-8121GPC/HT" manufactured by TOSOH Corporation
Measurement Conditions
    Columns: TSKgelGMHHR-H(20)HT columns×3
        TSKguardcolumn-HHR(30)HT column×1
    Mobile phase: o-DCB, 1.0 mL/min
    Sample concentration: 1 mg/mL
    Detector: Bryce refractometer
    Standard substance: polystyrene (molecular weight: 500 to 8,420,000 manufactured by TOSOH Corporation)
    Elution condition: 145° C.
    SEC temperature: 145° C.

The melting point of the polyolefin-based resin is not particularly limited, but is preferably 130 to 170° C., and more preferably 133 to 165° C. The melting point of the polypropylene-based resin is not particularly limited, but is preferably 160 to 170° C., and more preferably 160 to 165° C. The melting point of the polyethylene-based resin is not particularly limited, but is preferably 130 to 140° C., and more preferably 133 to 139° C. The polyolefin-based resin of which the melting point falls within the above-described range improves the compression recovery properties of the electret sheet. Thus, the electret sheet retains excellent piezoelectricity over a long period of time.

Note that, in the present invention, the melting point of the polyolefin-based resin can be measured in accordance with the following procedure using a differential scanning calorimeter (e.g., apparatus name: "DSC220C", manufactured by Seiko Instruments Inc., etc.). First, 10 mg of the polyolefin-based resin is heated from 25° C. to 250° C. at a temperature increasing rate of 10° C./min, and maintained over 3 minutes at 250° C. Next, the polyolefin-based resin is cooled from 250° C. to 25° C. at a temperature decreasing rate of 10° C./min, and maintained over 3 minutes at 25° C. Subsequently, the polyolefin-based resin is heated again from 25° C. to 250° C. at a temperature increasing rate of 10° C./min. The peak temperature at the endothermic peak in this reheating step is defined as the melting point of the polyolefin-based resin.

The electret sheet body preferably has through holes. The through holes preferably include through holes formed by continuously connecting adjacent micro pore portions with each other. The through holes preferably penetrate in a thickness direction of the electret sheet body. The through holes extend in the electret sheet body in the thickness direction thereof. One end of each of the through holes is opened to one surface of the electret sheet body, and another end of each of the through holes is opened to another surface of the electret sheet body. The through holes facilitates the adjustment of the air permeability within the aforementioned range. Thus, the compression recovery properties can be improved, and stuffiness can be suppressed even when the electret sheet is used by attaching it to the skin of a human body.

The electret sheet body preferably have micro pore portions. It is preferable that the micro pore portions be irregularly disposed in the electret sheet body.

The through holes may extend in a meandering manner or linearly extend in the thickness direction of the electret sheet body. The through holes preferably extend in a meandering manner. The through holes that extend in a meandering manner can stably retain electric charges in a vicinity of wall surface portions of the through holes and the micro pore portions over a long period of time. Thus, the electret sheet can stably retain more excellent piezoelectricity over a long period of time.

At a part of the through holes, a branched portion may be formed. An end of the branched portion may or may not be opened to the surface of the electret sheet body. However, the end of the branched portion is preferably opened to the surface of the electret sheet body.

The air permeability of the electret sheet is 10 to 1,000 sec/100 mL. A preferable lower limit of the air permeability is 20 sec/100 mL, and a more preferable upper limit thereof is 600 sec/100 mL. A more preferable lower limit thereof is 30 sec/100 mL, and a more preferable upper limit thereof is 150 sec/100 mL. A particularly preferable lower limit thereof is 30 sec/100 mL, and a particularly preferable upper limit thereof is 80 sec/100 mL. The electret sheet of which the air permeability is 10 sec/100 mL or more has improved charge retention properties. Thus, the electret sheet can retain excellent piezoelectricity over a long period of time. In addition, the electret sheet can further suppress stuffiness even when the electret sheet is used by attaching it to the skin of a human body. The electret sheet of which the air permeability is 1,000 sec/100 mL or less has improved compression recovery properties. Thus, the electret sheet can retain excellent piezoelectricity over a long period of time. In addition, the electret sheet can further suppress stuffiness even when the electret sheet is used by attaching it to the skin of a human body. The air permeability can be adjusted by the shapes of the through holes, the longer diameter of opening ends of the through holes, the pore density, and the like.

The air permeability of the electret sheet is measured at any ten positions under an atmosphere of 23° C. and a relative humidity of 65% in accordance with JIS P8117, and an arithmetic average thereof is calculated. The obtained value is defined as the air permeability of the electret sheet.

The air permeability of the electret sheet of which the through holes extend in a meandering manner is preferably 50 to 1,000 sec/100 mL. The electret sheet of which the air permeability falls within the aforementioned range has more excellent durability against a pressing force that is repetitively applied, that is, more excellent compression recovery properties. In addition, the electret sheet can further suppress stuffiness even when the electret sheet is used by attaching it to the skin of a human body. The air permeability of the electret sheet is more preferably 80 to 600 sec/100 mL, and particularly preferably 100 to 300 sec/100 mL.

The air permeability of the electret sheet of which the through holes linearly extend is preferably 10 to 300 sec/100 mL. The electret sheet of which the air permeability falls within the aforementioned range has excellent durability against a pressing force that is repetitively applied, that is, more excellent compression recovery properties. Even when the electret sheet is used by attaching it to the skin of a human body, stuffiness can be further suppressed. The air permeability of the electret sheet is more preferably 20 to 100 sec/100 mL, and particularly preferably 30 to 80 sec/100 mL.

Whether the through holes extend in a meandering manner or linearly extend is judged in accordance with the following standard. The electret sheet is cut in a thickness direction thereof, and an enlarged photograph thereof is taken at a magnification of 3,000 times. On the enlarged photograph, a straight line connecting centers of opening ends on both sides of each of the through holes is drawn as a baseline. On the enlarged photograph, the centers of the opening ends each are a point positioned on a straight line connecting opening end edges and at a center of the straight line. Two straight lines connecting a portion that is the farthest from the baseline of each of the through holes to each of the centers of the opening ends on both sides of each of the through holes are drawn as determination lines. An internal angle between the baseline and each of the determination lines of less than 15° means that the through holes linearly extend. An internal angle between the baseline and either of the determination lines of 15° or more means that the through holes extend in a meandering manner.

The largest longer diameter of opening ends of the through holes formed by continuously connecting the micro pore portions with each other in the electret sheet body is preferably 1 μm or less, more preferably 100 nm to 900 nm, and particularly preferably 200 nm to 600 nm. The electret sheet body of which the largest longer diameter of the opening ends of the through holes is 1 μm or less improves the charge retention properties of the electret sheet. Thus, the electret sheet can retain excellent piezoelectricity over a long period of time. The electret sheet body of which the largest longer diameter of the opening ends of the through holes is 100 nm or more further improves the compression recovery properties of the electret sheet. Thus, the electret sheet can retain more excellent piezoelectricity over a long period of time. In addition, the electret sheet can further suppress stuffiness even when the electret sheet is used by attaching it to the skin of a human body.

The average longer diameter of the opening ends of the through holes in the electret sheet body is preferably 500 nm or less, more preferably 100 nm to 500 nm, particularly preferably 200 nm to 500 nm, and the most preferably 250 to 350 nm. The electret sheet body of which the average longer diameter of the opening ends of the micro pore portions is 500 nm or less further improves the charge retention properties of the electret sheet. Thus, the electret sheet can retain more excellent piezoelectricity over a long period of time. The electret sheet body of which the average longer diameter of the opening ends of the through holes is 100 nm or more further improves the compression recovery properties of the electret sheet. Thus, the electret sheet can retain more excellent piezoelectricity over a long period of time. In addition, the electret sheet can further suppress stuffiness even when the electret sheet is used by attaching it to the skin of a human body.

The largest longer diameter and average longer diameter of the opening ends of the through holes in the electret sheet body are measured as follows. The surface of the electret sheet is first coated with carbon. Any ten positions of the surface of the electret sheet are photographed by a scanning electron microscope at a magnification of 10,000. A photographed region is a region of a plane rectangle with a length of 9.6 μm and a width of 12.8 μm in the surface of the electret sheet.

The longer diameter of each of the opening ends of the through holes in the obtained photographs is measured. The longer diameter of the opening end of the through hole is a diameter of a perfect circle with the shortest diameter capable of surrounding this opening end of the through hole. A through hole extending over the photographed region and a non-photographed region is excluded from a subject to be measured. Of the longer diameters of opening ends of the through holes in the photographs, the maximum longer diameter is defined as the largest longer diameter of the opening ends of the through holes of the electret sheet body. The arithmetic average of the longer diameters of the opening ends of the through holes in the photographs is defined as the average longer diameter of the opening ends of the through holes of the electret sheet body.

The pore density of the electret sheet is preferably 15 pores/μm² or more, and more preferably 17 pores/μm² or more. The electret sheet of which the pore density is 15 pores/μm² or more has further improved compression recovery properties. Thus, the electret sheet can retain more excellent piezoelectricity over a long period of time. In addition, the electret sheet can further suppress stuffiness even when the electret sheet is used by attaching it to the skin of a human body. The pore density of the electret sheet is preferably 50 pores/μm² or less, more preferably 40 pores/μm² or less, and particularly preferably 35 pores/μm² or less. The electret sheet of which the pore density is 50 pores/μm² or less has further improved charge retention properties. Thus, the electret sheet can retain more excellent piezoelectricity over a long period of time.

The pore density of the electret sheet is measured by the following procedure. A measurement portion of a plane rectangle with a length of 9.6 μm and a width of 12.8 μm is first set in any portion of the surface of the electret sheet, and photographed at a magnification of 10,000 times. The number of the opening ends of the through holes in the measurement portion is counted, and is divided by 122.88 μm² (9.6 μm×12.8 μm) to calculate the pore density. The number of through holes extending over the measurement portion and a non-measurement portion is counted as 0.5.

The porosity of the electret sheet is preferably 40 to 70%, more preferably 45 to 65%, and particularly preferably 50 to 60%. The electret sheet of which the porosity falls within the aforementioned range has further improved compression recovery properties. Thus, the electret sheet can retain more excellent piezoelectricity over a long period of time. In addition, the electret sheet can further suppress stuffiness even when the electret sheet is used by attaching it to the skin of a human body.

The porosity of the electret sheet can be measured by the following procedure. The electret sheet is first cut to obtain a test piece having a plane square with a length of 10 cm and a width of 10 cm (area: 100 cm²). Subsequently, the weight W (g) and thickness T (cm) of the test piece are measured, and the apparent density ρ (g/cm³) is calculated as follows. The thickness of the test piece is measured at 15 positions with a dial gauge (e.g., Signal ABS Digimatic Indicator manufactured by Mitutoyo Corporation), and the arithmetic average thereof is calculated as the thickness of the test piece. The porosity P (%) of the electret sheet can be calculated from the apparent density ρ (g/cm³) and the density $ρ_0$ (g/cm³) of the synthetic resin itself, constituting the electret sheet, using the following expression. The density $ρ_0$ (g/cm³) of the synthetic resin itself constituting the electret sheet is a value obtained from the mass and volume of the electret sheet in which cells are removed. Examples of a process of removing cells include a cooling process after heat-melting, and a treatment process in a supercritical state.

$$\text{Apparent density } ρ \text{ (g/cm}^3\text{)}=W/(100×T)$$

$$\text{Porosity } P[\%]=100×[(ρ_0-ρ)/ρ_0]$$

It is preferable that the electret sheet have a compression set of 20% or less during 50% compression in the thickness direction in accordance with JIS K6767. The compression set is more preferably 10% or more and 20% or less, and more preferably 13% or more and 18% or less. The electret sheet of which the compression set is 20% or less has further improved compression recovery properties. Thus, the electret sheet retains more excellent piezoelectricity over a long period of time.

The thickness of the electret sheet is preferably 10 to 300 μm, more preferably 12 to 100 μm, still more preferably 13 to 50 μm, and particularly preferably 14 to 30 μm. The electret sheet of which the thickness is 10 μm or more can hold more electric charges therein and thus has further improved piezoelectricity. The electret sheet of which the thickness is 300 μm or less allows positive electric charges and negative electric charges to be more effectively held in the polarization state in the vicinities of the wall portions of the through holes and the micro pore portions of the electret sheet. Thus, the electret sheet has further improved stability of the piezoelectricity.

Next, a method of manufacturing the electret sheet will be described. Although there is no particular limitation on the method of manufacturing the electret sheet, the following manufacturing method is preferable.

The electret sheet can be manufactured by a method including the following steps of:
an extrusion step of supplying a synthetic resin into an extruder for melting and kneading, and extruding the melted and kneaded synthetic resin from a T die which is attached to the tip of the extruder to obtain a synthetic resin sheet;
an aging step of aging the synthetic resin sheet obtained in the extrusion step for 1 minute or longer such that the surface temperature of the synthetic resin sheet falls within a range of (a melting point of the synthetic resin—30° C.) to (the melting point of the synthetic resin resin—1° C.)
a stretching step of uniaxially stretching the synthetic resin sheet after the aging step at a stretch ratio of 1.5 to 2.8 times;
an annealing step of annealing the synthetic resin sheet after the stretching step to manufacture an electret sheet body; and
a charging step of charging the electret sheet body.

Hereinafter, the manufacturing method of the electret sheet will be sequentially described.

(Extrusion Step)

First, the extrusion step of supplying a synthetic resin into an extruder for melting and kneading, and extruding the melted and kneaded synthetic resin from the T die which is attached to the tip of the extruder to obtain a synthetic resin sheet is performed.

The temperature of the synthetic resin when the synthetic resin is melted and kneaded by the extruder is preferably (the melting point of the synthetic resin+20° C.) to (the melting point of the synthetic resin+100° C.), and more preferably (the melting point of the synthetic resin+25° C.) to (the melting point of the synthetic resin+80° C.). Setting the temperature of the synthetic resin within the above-described range allows the synthetic resin to be highly oriented. Thus, the synthetic resin can form much lamellae.

The draw ratio when the synthetic resin is extruded from the extruder into a sheet shape is preferably 50 to 300, more preferably 55 to 280, particularly preferably 65 to 250, and most preferably 68 to 250. Setting the draw ratio to 50 or more allows molecules of the synthetic resin to be sufficiently oriented, so that the synthetic resin can sufficiently form lamellae. Setting the draw ratio to 300 or less can improve the film formation stability of the synthetic resin sheet, and improve the thickness accuracy and width accuracy of the synthetic resin sheet.

It is noted that the draw ratio refers to a value obtained by dividing the clearance of the lip of the T die by the thickness of the synthetic resin sheet extruded from the T die. The clearance of the lip of the T die can be determined by measuring the clearance of the lip of the T die at 10 or more locations using a feeler gauge (for example, a JIS feeler gauge manufactured by Nagai Gauge Seisakusho) in accordance with JIS B7524, and calculating an arithmetic mean value of the measured values. The thickness of the synthetic resin sheet extruded from the T die can be determined by measuring the thickness of the synthetic resin sheet extruded from the T die at 10 or more locations using a dial gauge (for example, Signal ABS Digimatic Indicator manufactured by Mitutoyo Corporation), and calculating an arithmetic mean value of the measured values.

The film forming rate of the synthetic resin sheet is preferably 10 to 300 m/min, more preferably 15 to 250 m/min, and particularly preferably 15 to 30 m/min. Setting the film forming rate of the synthetic resin sheet to 10 m/min or more allows molecules of the synthetic resin to be sufficiently oriented, so that the synthetic resin can sufficiently form lamellae. Also, setting the film forming rate of the synthetic resin sheet to 300 m/min or less can improve the film formation stability of the synthetic resin sheet, and improve the thickness accuracy and width accuracy of the synthetic resin sheet.

It is preferable that the synthetic resin sheet extruded from the T die be cooled until the surface temperature of the synthetic resin sheet becomes equal to or lower than (the melting point of the synthetic resin—100° C.) This can promote the crystallization of the synthetic resin and the generation of lamellae. Extruding the melted and kneaded synthetic resin allows the synthetic resin molecules constituting the synthetic resin sheet to be previously oriented, and then, the synthetic resin sheet is cooled. As a result, the generation of lamellae can be promoted in a portion where the synthetic resin is oriented.

The surface temperature of the cooled synthetic resin sheet is preferably equal to or lower than a temperature that is lower by 100° C. than the melting point of the synthetic resin, more preferably a temperature that is lower by 140 to 110° C. than the melting point of the synthetic resin, and particularly preferably a temperature that is lower by 135 to 120° C. than the melting point of the synthetic resin. Setting the surface temperature of the cooled synthetic resin sheet to a temperature equal to or lower than a temperature that is lower by 100° C. than the melting point of the synthetic resin allows the synthetic resin constituting the synthetic resin sheet to form lamellae sufficiently.

(Aging Step)

Next, the synthetic resin sheet obtained by the above-described extrusion step is aged. This aging step of the synthetic resin sheet is performed for growing the lamellae generated in the synthetic resin sheet during the extrusion step. This can form a laminated lamellae structure in which a crystallized portion (lamellae) and an amorphous portion are alternately arranged in the extrusion direction of the synthetic resin sheet. In the later-described stretching step of the synthetic resin sheet, a crack is caused to occur not in the lamella but between the lamellae. Furthermore, starting from this crack, minute through holes and micro pore portions can be formed.

The aging temperature of the synthetic resin sheet is preferably (the melting point of the synthetic resin—30° C.) to (the melting point of the synthetic resin—1° C.), and more preferably (the melting point of the synthetic resin—25° C.) to (the melting point of the synthetic resin—5° C.). Setting the aging temperature of the synthetic resin sheet to (the melting point of the synthetic resin—30° C.) or higher allows molecules of the synthetic resin to be sufficiently oriented and lamellae to be sufficiently grown. Also, setting the aging temperature of the synthetic resin sheet to (the melting point of the synthetic resin—1° C.) or lower allows molecules of the synthetic resin to be sufficiently oriented and lamellae to be sufficiently grown. It is noted that the aging temperature of the synthetic resin sheet refers to the surface temperature of the synthetic resin sheet.

The aging time of the synthetic resin sheet is preferably 1 minute or more, more preferably 3 minutes or more, particularly preferably 5 minutes or more, and most preferably 10 minutes or more. Aging the synthetic resin sheet performed for 1 minute or more can sufficiently and uniformly grow lamellae in the synthetic resin sheet. The excessively long aging time may cause the synthetic resin sheet to be thermally deteriorated. Thus, the aging time is preferably 30 minutes or less, and more preferably 20 minutes or less.

(Stretching Step)

Next, the stretching step of uniaxially stretching the synthetic resin sheet after the aging step is performed. In the stretching step, the synthetic resin sheet is preferably uniaxially stretched only in the extrusion direction. The uniaxial stretching of the synthetic resin sheet facilitates the adjustment of the air permeability of the electret sheet within the above-described range. Furthermore, the crack can be smoothly generated in the amorphous portions between the lamellae to produce micro pore portions and through holes in the electret sheet body.

The stretching method of the synthetic resin sheet in the stretching step is not particularly limited as long as the synthetic resin sheet can be uniaxially stretched. An example thereof includes a method of uniaxially stretching the synthetic resin sheet at a prescribed temperature using a uniaxially stretching apparatus. The stretching of the synthetic resin sheet is preferably performed by sequential stretching of performing stretching multiple times in a divided manner. The sequential stretching facilitates the adjustment of the air permeability within the above-described described.

In the case of forming the through holes extending in a meandering manner in the electret sheet body, the strain rate during the stretching of the synthetic resin sheet is preferably 200 to 350%/min, more preferably 200 to 300%/min, and particularly preferably 250 to 300%/min.

In the case of forming the through holes linearly extending in the electret sheet body, the strain rate during the stretching of the synthetic resin sheet is preferably 230%/min or less, more preferably 200%/min or less, and particularly preferably 150%/min or less. The lower limit of the strain rate during the stretching is not particularly limited, but is preferably 10%/min or more from the viewpoint of productivity.

The strain rate during the stretching of the synthetic resin sheet refers to a value calculated on the basis of the following formula. It is noted that the strain rate refers to a deformation strain per unit time $\varepsilon$ [%/min], which is calculated on the basis of a stretch ratio $\lambda$ [%], a line conveying rate V [m/min], and a stretch section length F [m]. The line conveying rate V refers to a conveying rate of the synthetic resin sheet at the entrance of the stretch section. The stretch section length F refers to a conveying distance from the entrance to the exit of the stretch section.

$$\text{Strain Rate } \varepsilon = \lambda \times V/F$$

In the stretching step, the surface temperature of the synthetic resin sheet is preferably (the melting point of the synthetic resin—100° C.) to (the melting point of the synthetic resin—5° C.), and more preferably (the melting point of the synthetic resin—30° C.) to (the melting point of the synthetic resin—10° C.). Setting the surface temperature within the above-described range can smoothly generate a crack in an amorphous portion between lamellae and produce micro pore portions and through holes, without breaking the synthetic resin sheet.

In the stretching step, the stretch ratio of the synthetic resin sheet is preferably 1.5 to 3.0 times, more preferably 2.0 to 2.9 times, and particularly preferably 2.3 to 2.8 times. Setting the stretch ratio within the above-described range allows the micro pore portions to be uniformly formed in the synthetic resin sheet. Thus, the accuracy of the piezoelectric sensor constituted using the electret sheet can be improved.

It is noted that the stretch ratio of the synthetic resin sheet refers to a value obtained by dividing the length of the synthetic resin sheet after stretching by the length of the synthetic resin sheet before stretching.

(Annealing Step)

Next, the annealing step of annealing the synthetic resin sheet after the stretching step to manufacture an electret sheet body is performed. This annealing step is performed for relieving the residual strain generated in the synthetic resin sheet due to the stretch applied in the above-described stretching step to prevent the obtained electret sheet from being thermally shrunk by heating.

The surface temperature of the synthetic resin sheet in the annealing step is preferably (the melting point of the synthetic resin—40° C.) to (the melting point of the synthetic resin—5° C.). Setting the surface temperature within the above-described range can prevent the through hole, which is formed in the stretching step, from being clogged. As a result, the compression recovery properties of the electret sheet are further improved, and the electret sheet can retain more excellent piezoelectricity over a long period of time. In addition, the electret sheet can further suppress stuffiness even when the electret sheet is used by attaching it to the skin of a human body.

(Charging Step)

The electret sheet body manufactured in the annealing step is charged to express piezoelectricity in the electret sheet body. Thus, the electret sheet can be manufactured.

A method of charging the electret sheet body is not particularly limited, and examples thereof include a method of applying direct-current electrolysis to the electret sheet body.

The method of applying a direct-current electric field to the electret sheet body is not particularly limited, and examples thereof include the following methods:

(1) a method of charging the electret sheet body by placing the electret sheet body between a pair of plate electrodes, connecting the plate electrode in contact with a surface of the electret sheet body to be charged to a high-voltage direct-current power supply and grounding the other plate electrode, and applying a direct current or pulsed high voltage to the electret sheet body to inject electric charges into the synthetic resin; and (2) a method of charging the electret sheet body by overlaying a grounded plate electrode on a first surface of the electret sheet body in tight contact with each other, arranging needle-shaped electrodes or wire electrodes electrically connected to a direct-current high-voltage power supply at predetermined intervals on a side of a second surface of the electret sheet body, and generating corona discharge by electric field concentration near tips of the needle-shaped electrodes or surfaces of the wire electrodes, to ionize air molecules and to repel air ions by the polarity of the needle-shaped electrodes or the wire electrodes.

The absolute value of a direct-current processing voltage during application of the direct-current electric field to the electret sheet body is preferably 5 to 40 kV, and more preferably 10 to 30 kV. The direct-current processing voltage which is adjusted to fall within the aforementioned range improves the retention of the piezoelectricity of the resulting electret sheet at a high temperature.

(Piezoelectric Sensor)

A piezoelectric sensor is constituted by layering or integrally layering a signal electrode 2 on a first surface (one principal surface) of an electret sheet 1 and layering or integrally layering a ground electrode 3 on a second surface (another principal surface) of the electret sheet 1. A potential generated in the electret sheet can be measured by measuring the potential of the signal electrode 2 using the ground electrode 3 as a reference electrode.

It is preferable that the signal electrode be integrally layered on the first surface (the principal surface) of the electret sheet 1 by intermediary of a fixative, as necessary. Similarly, it is preferable that the ground electrode be integrally layered on the second surface (the other principal surface) of the electret sheet 1 by intermediary of a fixative, as necessary. The signal electrode 2 and the ground electrode 3 are not particularly limited as long as they are electro conductive, and examples thereof include metal sheets such as a copper foil and an aluminum foil, and conductive films.

When the signal electrode 2 and the ground electrode 3 are constituted by a conductive film, the conductive film may be formed on an electric insulating sheet and then integrally layered on the electret sheet, or directly formed on the surface of the electret sheet. Examples of a method of forming the conductive film on the electric insulating sheet or the electret sheet include (1) a method of applying a conductive paste that contains conductive fine particles in a binder to the electric insulating sheet or the electret sheet, followed by drying to form the conductive film, and (2) a method of forming the conductive film on the electric insulating sheet or the electret sheet by vapor deposition.

The electric insulating sheet is not particularly limited as long as it has electrical insulation properties, and examples thereof include a polyimide sheet, a polyethylene terephthalate sheet, a polyethylene naphthalate sheet, and a polyvinyl chloride sheet.

As the fixative that constitutes a fixative layer, a reactive, solvent-based, water-based, or hot-melt adhesive or tackifier can be used. From the viewpoint of maintaining the sensitivity of the electret sheet, a fixative having low dielectric constant is preferable.

A case where the piezoelectric sensor is constituted by layering the signal electrode 2 on the first surface of one electret sheet 1 and layering the ground electrode 3 on the second surface is described above. However, a plurality of electret sheets are layered so that the electret sheets are in contact with one another or by intermediary of a sheet having air permeability, to produce a layered sheet, and the whole layered sheet may be defined as the electret sheet of the present invention. The piezoelectric sensor may be constituted by layering the signal electrode on a first surface of the layered sheet and layering the ground electrode on a second surface of the layered sheet.

The sheet having air permeability is not particularly limited, and examples thereof include a synthetic resin sheet having through holes and a nonwoven fabric.

As described above, the electret sheet has excellent compression recovery properties, and stably retains excellent piezoelectricity over a long period of time. In addition, the electret sheet can prevent stuffiness even when the electret sheet is used by attaching it to the skin of a human body.

EXAMPLES

Hereinafter, Examples of the present invention will be described. However, the present invention is not limited to the following Examples.

Examples 1 to 7 and Comparative Examples 5 and 6

(Extrusion Step)

A homopolypropylene having a weight-average molecular weight Mw, a number-average molecular weight Mn, a molecular weight distribution (Mw/Mn), and a melting point that were shown in Table 1 was supplied to an extruder, melted and kneaded at a resin temperature shown in Table 1, and extruded from a T die, which was attached to a tip of the extruder, in a sheet form. Subsequently, the sheet was cooled until the surface temperature became 30° C. As a result, a long-length homopolypropylene sheet having a thickness of 18 μm and a width of 200 mm was obtained. The film forming rate, extrusion output, and draw ratio are as shown in Table 1.

(Aging Step)

The homopolypropylene sheet was then aged for a time shown in Table 1 (aging time) so that the surface temperature of the homopolypropylene sheet became an aging temperature shown in Table 1.

(Stretching Step)

Subsequently, the aged homopolypropylene sheet was uniaxially stretched at a strain rate shown in Table 1 at a stretch ratio shown in Table 1 only in an extrusion direction by a uniaxial stretching apparatus so that the surface temperature of the homopolypropylene sheet became a temperature shown in Table 1.

(Annealing step)

After stretching, the homopolypropylene sheet was supplied to a hot air oven, and heated for 1 minute so that the surface temperature of the homopolypropylene sheet became a temperature shown in Table 1 without applying a tensile force to the homopolypropylene sheet. In this manner, the homopolypropylene sheet was annealed to manufacture an electret sheet body. The thickness of the electret sheet body (the homopolypropylene sheet after annealing) was as shown in Table 3. The shrinkage ratio of the homopolypropylene sheet in the annealing step was a value shown in Table 1.

(Charging Step)

On a first surface of the electret sheet body, a grounded plate electrode was overlapped in tight contact with each other, and needle-shaped electrodes electrically connected to a direct-current high-voltage power supply were disposed at predetermined intervals on a side of a second surface of the electret sheet body. Corona discharge was then generated by electric field concentration near the surfaces of the needle-shaped electrodes under conditions of a voltage of −15 kV, a discharge distance of 30 mm, and a voltage application time of 1 minute. Air molecules were ionized and air ions generated by the polarity of the needle-shaped electrodes were repelled, so that electric charges were injected into the electret sheet body (homopolypropylene sheet) with a direct-current electric field applied. Thus, the whole electret sheet body (homopolypropylene sheet) was charged. After that, the electret sheet body (homopolypropylene sheet) into which electric charges had been injected was maintained at 80° C. for 3 hours with the electret sheet body wrapped with a grounded aluminum foil. Thus, the electret sheet body was charged to obtain an electret sheet. In the charging step, the electret sheet body was only charged, and the physical structure thereof was not changed.

In Examples 1 to 3, 5, and 7, and Comparative Example 6, through holes of the electret sheets extended in a meandering manner. In Examples 4 and 6, and Comparative Example 5, through holes of the electret sheets linearly extended.

Comparative Examples 1 to 4

The following propylene-ethylene random copolymers were prepared as a polypropylene-based resin.

Polypropylene-based resin A (a propylene-ethylene random copolymer, trade name "NOVATEC EG8B" manufactured by Japan Polypropylene Corp., content of ethylene unit: 5% by mass)

Polypropylene-based resin B (a propylene-ethylene random copolymer, trade name "WINTEC WFW4" manufactured by Japan Polypropylene Corp., content of ethylene unit: 2% by mass)

(Extrusion Step)

The polypropylene-based resin A, the polypropylene-based resin B, trimethylolpropane trimethacrylate (TMPTM), azodicarbonamide, and a phenolic antioxidant were supplied to an extruder in respective predetermined amounts shown in Table 2. The mixture was melted and kneaded at a resin temperature shown in Table 2, and extruded from a T die in a sheet form, to manufacture a foamable resin sheet. The thickness of the foamable resin sheet was shown in Table 2.

(Electron Beam Irradiation Step)

Both surfaces of the obtained foamable resin sheet were irradiated with an electron beam under conditions of an accelerating voltage of 500 kV and an irradiation intensity of 25 kGy, to crosslink the polypropylene-based resin constituting the foamable resin sheet.

(Foaming Step)

The crosslinked foamable resin sheet was supplied to a foaming furnace, which was maintained at 250° C., and foamed, to obtain a polypropylene-based resin foamed sheet. The foaming ratio and thickness of the polypropylene-based resin foamed sheet were shown in Table 2.

(Stretching Step)

While a melting state of the obtained polypropylene-based resin foamed sheet was maintained, the polypropylene-based resin foamed sheet was stretched in a widthwise direction by continuously aspirating ends thereof in the widthwise direction by an aspirating-type guider, so that cells were stretched in a direction (widthwise direction) orthogonal to an extrusion direction. Thus, a polypropylene-based resin foamed sheet having stretched cells was obtained. The stretch ratio and thickness of the polypropylene-based resin foamed sheet were shown in Table 2.

(Charging Step)

On a first surface of the polypropylene-based resin foamed sheet, a grounded plate electrode was overlapped in tight contact with each other, and needle-shaped electrodes electrically connected to a direct-current high-voltage power supply were disposed at predetermined intervals on a side of a second surface of the polypropylene-based resin foamed sheet. Corona discharge was then generated by electric field concentration near the surfaces of the needle-shaped electrodes under conditions of a voltage of −15 kV, a discharge distance of 30 mm, and a voltage application time of 1 minute to ionize air molecules. The air ions were repelled by the polarity of the needle-shaped electrodes to apply a direct-current electric field to the homopolypropylene-based resin foamed sheet, so that electric charges were injected into the homopolypropylene-based resin foamed sheet. Thus, the whole polypropylene-based resin foamed sheet was charged. After that, the polypropylene-based resin foam sheet into which electric charges had been injected was maintained at 80° C. for 3 hours with the polypropylene-based resin foam sheet wrapped with a grounded aluminum foil. Thus, an electret sheet was obtained.

The air permeability, compression set during 50% compression in the thickness direction in accordance with JIS K6767, porosity, pore density, and thickness of each of the obtained electret sheets, and the largest longer diameter and average longer diameter of opening ends of through holes of each of the electret sheet bodies were measured by the aforementioned procedures. The results are shown in Table 3. The electret sheets of Comparative Examples 1 to 4 had no through holes, and thus, the largest longer diameter and average longer diameter of opening ends of through holes and air permeability were not measured.

A piezoelectric constant d33, a repetition durability test (rate of change of thickness), and prevention of stuffiness of each of the obtained electret sheets were measured by the following procedures. The results are shown in Table 2.

(Piezoelectric Constant d33)

The electret sheets each were cut into a test piece having a flat square shape with a side of 10 mm. Both surfaces of the test piece were subjected to gold vapor deposition to produce a test body.

A pressing force was applied to the test body using a vibration exciter under conditions of a load F of 2 N, a dynamic load of ±0.25 N, and a frequency of 110 Hz, and an electric charge Q (coulomb) generated at that time was measured. The electric charge Q (coulomb) was divided by the load F (N), to obtain the piezoelectric constant d33. In a piezoelectric constant dij, j means a direction of a load, and i means a direction of an electric charge. The d33 represents the piezoelectric constant for the load in a thickness direction of the electret sheet and the electric charge in a thickness direction of the electret sheet.

The electret sheet wrapped with an aluminum foil was allowed to stand in a thermo-hygrostat bath set at 80° C. for 3 hours. The electret sheet was then allowed to stand in a thermo-hygrostat bath set at 23° C. for 24 hours. The piezoelectric constant d33 of the electret sheet was measured as a piezoelectric constant d33.

(Repetition Durability Test)

The thickness of the electret sheet was measured. Subsequently, the electret sheet was repeatedly compressed 10,000 times under a stress of 100 kPa. After the repetitive compression, the electret sheet was allowed to stand for 10 minutes, the thickness thereof was measured, and the rate of change of thickness was calculated and evaluated.

Rate of change of thickness (%)=100×[(thickness after compression)−(thickness before compression)]/(thickness before compression)

(Prevention of Stuffiness)

The electret sheet of each of Examples and Comparative Examples was attached to the skin surface of a subject using a double-stick tape. Three hours after attachment, prevention of stuffiness was evaluated. The number of subjects was ten. Evaluation was performed in accordance with the following criteria.

A: Seven or more subjects did not feel stuffiness.
B: Five to six subjects did not feel stuffiness.
C: Four or less subjects did not feel stuffiness.

TABLE 1

| | | EXAMPLE | | | | |
|---|---|---|---|---|---|---|
| | | 1 | 2 | 3 | 4 | 5 |
| HOMOPOLYPROPYLENE | WEIGHT-AVERAGE MOLECULAR WEIGHT Mw | 421000 | 390000 | 421000 | 421000 | 421000 |
| | NUMBER-AVERAGE MOLECULAR WEIGHT Mn | 44700 | 48800 | 44700 | 44700 | 44700 |
| | MOLECULAR WEIGHT DISTRIBUTION (Mw/Mn) | 9.4 | 8.0 | 9.4 | 9.4 | 9.4 |
| | MELTING POINT (° C.) | 163 | 165 | 163 | 163 | 163 |
| EXTRUSION STEP | RESIN TEMPERATURE (° C.) | 220 | 220 | 220 | 220 | 220 |
| | FILM FORMING RATE (m/min) | 22 | 22 | 18 | 22 | 22 |
| | EXTRUSION OUTPUT (kg/hour) | 12 | 12 | 12 | 12 | 12 |
| | DRAW RATIO | 70 | 70 | 55 | 70 | 80 |
| AGING STEP | AGING TEMPERATURE (° C.) | 147 | 147 | 148 | 147 | 147 |
| | AGING TIME (min) | 10 | 10 | 12 | 10 | 10 |
| STRETCHING STEP | SURFACE TEMPERATURE (° C.) | 140 | 140 | 140 | 140 | 140 |
| | STRETCH RATIO (time) | 3.2 | 3.0 | 2.5 | 2.5 | 1.4 |
| | STRAIN RATE (%/min) | 250 | 280 | 240 | 80 | 250 |
| ANNEALING STEP | SHRINKAGE RATE (%) | 7 | 10 | 14 | 14 | 7 |

TABLE 1-continued

|  |  | EXAMPLE | | COMPARATIVE EXAMPLE | |
|---|---|---|---|---|---|
|  |  | 6 | 7 | 5 | 6 |
| HOMOPOLYPROPYLENE | WEIGHT-AVERAGE MOLECULAR WEIGHT Mw | 421000 | 390000 | 421000 | 421000 |
|  | NUMBER-AVERAGE MOLECULAR WEIGHT Mn | 44700 | 48800 | 44700 | 44700 |
|  | MOLECULAR WEIGHT DISTRIBUTION (Mw/Mn) | 9.4 | 8.0 | 9.4 | 9.4 |
|  | MELTING POINT (° C.) | 163 | 165 | 163 | 163 |
| EXTRUSION STEP | RESIN TEMPERATURE (° C.) | 220 | 220 | 220 | 220 |
|  | FILM FORMING RATE (m/min) | 22 | 22 | 22 | 22 |
|  | EXTRUSION OUTPUT (kg/hour) | 12 | 12 | 12 | 12 |
|  | DRAW RATIO | 70 | 70 | 70 | 80 |
| AGING STEP | AGING TEMPERATURE (° C.) | 146 | 147 | 146 | 147 |
|  | AGING TIME (min) | 12 | 12 | 10 | 10 |
| STRETCHING STEP | SURFACE TEMPERATURE (° C.) | 140 | 140 | 140 | 140 |
|  | STRETCH RATIO (time) | 3.7 | 2.2 | 4.0 | 1.2 |
|  | STRAIN RATE (%/min) | 80 | 240 | 80 | 250 |
| ANNEALING STEP | SHRINKAGE RATE (%) | 16 | 14 | 18 | 7 |

TABLE 2

|  |  | COMPARATIVE EXAMPLE | | | |
|---|---|---|---|---|---|
|  |  | 1 | 2 | 3 | 4 |
| EXTRUSION STEP | POLYPROPYLENE-BASED RESIN A (part by mass) | 30 | 30 | 30 | 30 |
|  | POLYPROPYLENE-BASED RESIN B (part by mass) | 70 | 70 | 70 | 70 |
|  | TMPTM (part by mass) | 3 | 3 | 3 | 3 |
|  | AZODICARBONAMIDE (part by mass) | 2.5 | 2.5 | 4 | 4 |
|  | PHENOLIC ANTIOXIDANT (part by mass) | 2 | 2 | 2 | 2 |
|  | RESIN TEMPERATURE (° C.) | 140 | 140 | 140 | 140 |
|  | THICKNESS OF SHEET (μm) | 300 | 300 | 350 | 300 |
| ELECTRON BEAM IRRADIATION STEP | ACCELERATING VOLTAGE (kV) | 500 | 500 | 500 | 500 |
|  | IRRADIATION STRENGTH (kGy) | 25 | 25 | 25 | 25 |
| FOAMING STEP | FURNACE TEMPERATURE (° C.) | 250 | 250 | 250 | 250 |
|  | FOAMING RATIO (time) | 2.5 | 2.5 | 3.8 | 3.2 |
|  | THICKNESS OF SHEET (μm) | 300 | 350 | 400 | 320 |
| STRETCHING STEP | STRETCH RATIO (time) | 4 | 3.5 | 3.5 | 3.5 |
|  | THICKNESS OF SHEET (μm) | 40 | 50 | 80 | 60 |

TABLE 3

|  | EXAMPLE | | | | |
|---|---|---|---|---|---|
|  | 1 | 2 | 3 | 4 | 5 |
| THICKNESS (μm) | 16 | 16 | 16 | 16 | 16 |
| POROSITY (%) | 62 | 54 | 54 | 56 | 45 |
| LARGEST LONGER DIAMETER OF OPENING ENDS OF THROUGH HOLES (nm) | 550 | 480 | 430 | 400 | 330 |
| AVERAGE LONGER DIAMETER OF OPENING ENDS OF THROUGH HOLES (nm) | 270 | 260 | 230 | 220 | 190 |
| AIR PERMEABILITY (sec/100 mL) | 100 | 190 | 80 | 48 | 1000 |
| COMPRESSION SET (%) | 15 | 18 | 13 | 11 | 18 |
| PORE DENSITY (pore/μm$^2$) | 31 | 20 | 19 | 21 | 17 |
| PIEZOELECTRIC CONSTANT d33 | 88 | 85 | 70 | 60 | 72 |
| RATE OF CHANGE OF THICKNESS (%) | −0.5 | 0 | −0.5 | 0 | 0 |
| STUFFINESS PREVENTION | B | B | B | A | B |
| FORM OF THROUGH HOLES | MEANDERING FORM | MEANDERING FORM | MEANDERING FORM | LINEAR FORM | MEANDERING FORM |

|  | EXAMPLE | | COMPARATIVE EXAMPLE | | |
|---|---|---|---|---|---|
|  | 6 | 7 | 1 | 2 | 3 |
| THICKNESS (μm) | 16 | 16 | 40 | 50 | 80 |
| POROSITY (%) | 70 | 49 | 60 | 60 | 74 |

TABLE 3-continued

| | | | | | |
|---|---|---|---|---|---|
| LARGEST LONGER DIAMETER OF OPENING ENDS OF THROUGH HOLES (nm) | 620 | 400 | — | — | — |
| AVERAGE LONGER DIAMETER OF OPENING ENDS OF THROUGH HOLES (nm) | 320 | 210 | — | — | — |
| AIR PERMEABILITY (sec/100 mL) | 10 | 400 | — | — | — |
| COMPRESSION SET (%) | 10 | 22 | 32 | 31 | 38 |
| PORE DENSITY (pore/μm²) | 35 | 17 | — | — | — |
| PIEZOELECTRIC CONSTANT d33 | 55 | 70 | 85 | 80 | 85 |
| RATE OF CHANGE OF THICKNESS (%) | −0.8 | −0.6 | −5.5 | −4.5 | −6 |
| STUFFINESS PREVENTION | A | B | C | C | C |
| FORM OF THROUGH HOLES | LINEAR FORM | MEANDERING FORM | — | — | — |

| | | COMPARATIVE EXAMPLE | | |
|---|---|---|---|---|
| | | 4 | 5 | 6 |
| | THICKNESS (μm) | 60 | 16 | 16 |
| | POROSITY (%) | 69 | 80 | 35 |
| | LARGEST LONGER DIAMETER OF OPENING ENDS OF THROUGH HOLES (nm) | — | 650 | 300 |
| | AVERAGE LONGER DIAMETER OF OPENING ENDS OF THROUGH HOLES (nm) | — | 380 | 160 |
| | AIR PERMEABILITY (sec/100 mL) | — | 5 | 1100 |
| | COMPRESSION SET (%) | 35 | 12 | 35 |
| | PORE DENSITY (pore/μm²) | — | 40 | 10 |
| | PIEZOELECTRIC CONSTANT d33 | 97 | 30 | 55 |
| | RATE OF CHANGE OF THICKNESS (%) | −5.5 | −0.5 | −4.5 |
| | STUFFINESS PREVENTION | C | B | C |
| | FORM OF THROUGH HOLES | — | LINEAR FORM | MEANDERING FORM |

INDUSTRIAL APPLICABILITY

The electret sheet of the present invention has excellent compression recovery properties. In addition, the electret sheet can suppress stuffiness even when used by attaching it to the skin of a human body. A piezoelectric sensor can be constituted by layering a signal electrode on a first surface of the electret sheet of the present invention and layering a ground electrode on a second surface thereof. The piezoelectric sensor can detect various stresses and motions. The piezoelectric sensor can measure a biological signal such as a pulse wave, a respiration, or a body motion with precision. The piezoelectric sensor can be used by attaching it to the skin of a human body. Even when the piezoelectric sensor is attached to the skin surface of a human body, the piezoelectric sensor can suppress stuffiness and smoothly measure biological signals.

CROSS-REFERENCE TO RELATED APPLICATION

The present application claims the priority under Japanese Patent Application No. 2018-157398 filed on Aug. 24, 2018, the disclosure of which is hereby incorporated in its entirety by reference.

REFERENCE SIGNS LIST

1 electret sheet
2 signal electrode
3 ground electrode

The invention claimed is:

1. An electret sheet having an air permeability of 10 to 1,000 sec/100 mL, and having a compression set of 20% or less during 50% compression in a thickness direction in accordance with JIS K6767.

2. The electret sheet according to claim 1, having through holes of which a largest longer diameter of opening ends is 1 μm or less.

3. The electret sheet according to claim 2, wherein an average longer diameter of the opening ends of the through holes is 500 nm or less.

4. The electret sheet according to claim 1, having a porosity of 40% or more and 70% or less.

5. The electret sheet according to claim 1, having a pore density of 15 pores/μm 2 or more.

6. The electret sheet according to claim 1, wherein the electret sheet has been uniaxially stretched under a condition of a strain rate of 230%/min or less.

7. A piezoelectric sensor comprising the electret sheet according to claim 1, a signal electrode layered on a first surface of the electret sheet, and a ground electrode layered on a second surface of the electret sheet.

8. A method of manufacturing an electret sheet, comprising:
an extrusion step of obtaining a synthetic resin sheet;
an aging step of aging the synthetic resin sheet obtained in the extrusion step such that a surface temperature of the synthetic resin sheet becomes [(a melting point of a synthetic resin)−30° C.] or higher and [(the melting point of the synthetic resin resin)−1° C.] or lower;

a stretching step of uniaxially stretching the synthetic resin sheet after the aging step;

an annealing step of annealing the synthetic resin sheet after the stretching step; and a charging step of charging the synthetic resin sheet, and wherein the electret sheet is the electret sheet according to claim 1.

* * * * *